United States Patent
Kuo et al.

(10) Patent No.: US 7,361,218 B2
(45) Date of Patent: Apr. 22, 2008

(54) METHOD AND APPARATUS FOR FABRICATING A CRYSTAL FIBER

(75) Inventors: Chia-Chang Kuo, Kaohsiung (TW); Li-Min Lee, Chaojhou Township, Pingtung County (TW); Yu-Chieh Cho, Taipei (TW); Sheng-Lung Huang, Kaohsiung (TW); Sheng Bang Huang, Hsinchu (TW)

(73) Assignee: National Sun Yat-Sen University, Kaohsiung (TW)

( * ) Notice: Subject to any disclaimer, the term of this patent is extended or adjusted under 35 U.S.C. 154(b) by 381 days.

(21) Appl. No.: 10/984,722

(22) Filed: Nov. 9, 2004

(65) Prior Publication Data

US 2005/0259940 A1    Nov. 24, 2005

(30) Foreign Application Priority Data

May 20, 2004    (TW) ............................... 93114270 A

(51) Int. Cl.
*C30B 15/20*    (2006.01)

(52) U.S. Cl. .............................. 117/13; 117/20; 117/25; 117/944

(58) Field of Classification Search ................. 117/13, 117/20, 25, 944
See application file for complete search history.

(56) References Cited

U.S. PATENT DOCUMENTS 4,421,721 A    12/1983    Byer et al.
5,171,400 A *  12/1992    Magel et al. ................ 117/19
5,504,616 A    4/1996     Shinozaki et al.
5,714,198 A    2/1998     Byer et al.
6,013,221 A    1/2000     Byer et al.

OTHER PUBLICATIONS

Y.C. Cho, et al; Fabrication of Nonlinear Photonic Crystal Fiber; Cleo/Pacific Rim 2003; The 5th Pacific Rim Conference Lasers and Electro-Optics; Dec. 19, 2003.

L.M. Lee, et al; Fabrication and Characterization of . . . Technique; 2004 Cleo/IQEC Conference in San Francisco, California; May 21, 2004.

* cited by examiner

*Primary Examiner*—Robert Kunemund
(74) *Attorney, Agent, or Firm*—Ladas and Parry LLP

(57) ABSTRACT

The present invention relates to a method for fabricating a crystal fiber having different regions of polarization inversion, comprising the following steps: (a) providing a source material; (b) putting the source material into a fabricating apparatus; and (c) forming the crystal fiber from the source material, and applying an external electric field on the grown crystal fiber during the growth procedure of the crystal fiber so as to induce micro-swing of the crystal fiber for polarization inversion, whereby poling at the time a ferroelectric crystalline body is being formed, whereas the conventional methods are designed for poling a ferroelectric crystalline body after it has been formed.

17 Claims, 5 Drawing Sheets

METHOD AND APPARATUS FOR FABRICATING A CRYSTAL FIBER

BACKGROUND OF THE INVENTION

1. Field of the Invention

The present invention relates to a method and an apparatus for fabricating a crystal fiber, and more particularly, to a method and an apparatus that an external electric field is applied on the grown crystal fiber during the growth procedure of the crystal fiber so as to induce micro-swing of the crystal fiber and form regions of reversed ferroelectric polarities.

2. Description of the Related Art

Ferroelectric materials, for example, lithium niobate ($LiNbO_3$), lithium tantalate ($LiTaO_3$) and potassium titanyl phosphate (KTP), are widely used in the manufacture of optical elements because of their high nonlinear coefficient and other excellent properties. One known example is that the technique of achieving quasi-phase matching (QPM) by periodically poling can effectively generate light with sum frequency generation (SFG), second harmonic generation (SHG) or difference frequency generation (DFG).

The procedure of creating regions of different polarization vectors is referred to in the art as "poling". In the present, the relative successful periodically poled method is to define a periodical electrode on the ferroelectric material and provide a high-voltage electric field (about 20 to 28 kV/mm). The periodical electrode can be made on the metal film directly, or by covering a periodical photoresist layer on the metal electrode or between the electrolytic liquid. However, the above-mentioned poling techniques are accomplished after the growth of the ferroelectric material.

U.S. Pat. Nos. 5,504,616, 5,714,198 and 6,013,221 defined the desired periodical electrode by complicated semiconductor process to accomplish periodically poled domains. In order to accomplish periodically poled domains, an additional high-voltage electric field or an additional chemical process is needed according to the above-mentioned methods, and the poling procedure is accomplished after the growth of the crystalline material. Additionally, the periodically poled crystal fabricated by the semiconductor process is mostly bulk material that has the disadvantages of being difficult to match with the conventional fiber and of poor mode matching. Further, the waveguide structure material made by the above-mentioned methods also has the disadvantages of poor coupling efficiency with fiber and complicated fabrication process.

U.S. Pat. No. 5,171,400 disclosed a method including laser heated pedestal growth (LHPG) and heat modulation so as to fabricate a lithium niobate crystal fiber that has a domain period of 2.7 μm and a diameter of 500 μm. However, such crystal fiber has the disadvantages of large variation of diameter of the crystal fiber, uneven domain period and difficulty in controlling the manufacture conditions.

Consequently, there is an existing need for a novel and improved method and an apparatus for fabricating a crystal fiber to solve the above-mentioned problems.

SUMMARY OF THE INVENTION

One objective of the present invention is to provide an apparatus and method for creating different regions of polarization inversion on the ferroelectric crystalline material. A significant advantage of the present invention over prior art is that it is applicable to poling at the time a ferroelectric crystalline body is being formed, whereas the conventional methods are designed for poling a ferroelectric crystalline body after it has been formed.

Another objective of the present invention is to provide an apparatus and method for fabricating a crystal fiber that has different regions of polarization inversion and has the advantages of high quality and high coupling efficiency so that it is used for applications in wavelength converter and visible light generation.

Yet another objective of the present invention is to provide a method for fabricating a crystal fiber having different regions of polarization inversion, comprising:
(a) providing a source material;
(b) putting the source material into a fabricating apparatus; and
(c) forming the crystal fiber from the source material and applying an external electric field on the grown crystal fiber during the growth procedure of the crystal fiber so as to induce micro-swing of the crystal of the crystal fiber for polarization inversion.

Still another objective of the present invention is to provide an apparatus for making a source material into a crystal fiber having different regions of polarization inversion. The apparatus of the present invention comprises a laser beam generator, a beam splitter, a bending mirror, a paraboloidal mirror and an electric field generating device. The laser beam generator is used for generating a laser beam. The beam splitter is used for splitting the laser beam into a generally annular beam. The bending mirror is used for reflecting the annular beam from the beam splitter. The paraboloidal mirror is used for reflecting the annular beam from the bending mirror and focusing the annular beam on the molten zone between the source material and the crystal fiber. The electric field generating device is disposed near the molten zone for providing an external electric field which is used for poling the crystal fiber and inducing micro-swing of the crystal of the crystal fiber.

BRIEF DESCRIPTION OF THE DRAWINGS

FIG. 4b shows a cross sectional view of the lower portion of the molten zone of FIG. 4a;

FIGS. 5a to 5c show the micro-swing occurred during the growth of the crystal fiber according to the present invention; wherein FIG. 5b shows the appearance of the crystal fiber without being applied by any external electric field, FIG. 5a shows that the crystal fiber swings to the left when being applied by an external electric field, and FIG. 5c shows that the crystal fiber swings to the right when being applied by an external electric field;

DETAILED DESCRIPTION OF THE INVENTION

Figure 1:
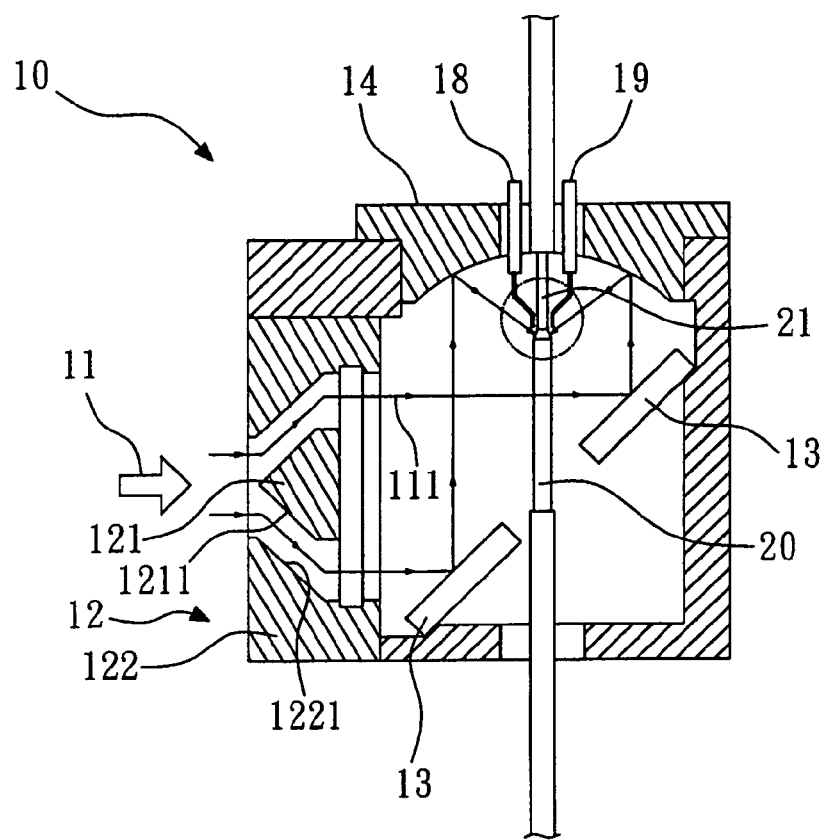
FIG. 1 shows a schematic diagram of a chamber of an apparatus for fabricating a crystal fiber according to the present invention.

FIG. 1 shows a schematic diagram of a chamber of an apparatus for fabricating a crystal fiber according to the present invention. The apparatus 10 is similar to a laser heated pedestal growth (LHPG) apparatus, which is used for making a source material into a crystal fiber 21 having different regions of polarization inversion. The material of the source material may be crystal (for example, a source crystal rod 20) or powder. The apparatus 10 comprises a laser beam generator (not shown), a beam splitter 12, a bending mirror 13, a paraboloidal mirror 14 and an electric field generating device.

The laser beam generator is used for generating a laser beam 11. The beam splitter 12 includes an outer cone 121 and an inner cone 122. The outer cone 121 has a first conical surface 1211 and the inner cone 122 has a second conical surface 1221, respectively. The beam splitter 12 is used for splitting the laser beam 11 into a generally annular beam 111. The bending mirror 13 is used for reflecting the annular beam 111 from the beam splitter 12 and projecting it to the paraboloidal mirror 14. The paraboloidal mirror 14 is used for reflecting the annular beam 111 from the bending mirror 13, and focusing the annular beam 111 at the tip of the source crystal rod 20. The electric field generating device is used for providing an external electric field which is used for poling the crystal fiber 21 and inducing micro-swing of the crystal of the crystal fiber 21. In the embodiment, the electric field generating device includes a first metal electrode 18 and a second metal electrode 19.

Figure 2:
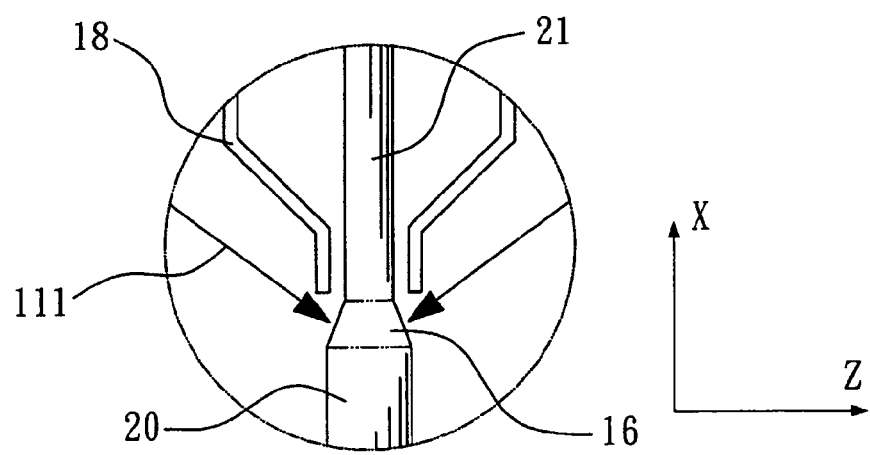
FIG. 2 shows a local enlarged view of the molten zone of FIG. 1.

FIG. 2 is a local enlarged view of FIG. 1, which shows a molten zone 16 at the tip of the source crystal rod 20. The tip of the source crystal rod 20 can be melted to form the molten zone 16 by utilizing the laser beam 11 with desired output power from the laser beam generator. The material of the source crystal rod 20 is ferroelectric and is selected from the group consisting of lithium niobate ($LiNbO_3$), lithium tantalate ($LiTaO_3$), patassium titanyl phosphate (KTP) and a dopant therein. The dopant is selected from the group consisting of the oxidation states of magnesium, zinc, yttrium, neodymium and erbium, and the mixture thereof. In the embodiment, the material of the source crystal rod 20 is lithium niobate doped with 6% mol of zinc oxide (ZnO).

It is found that the diameter of the crystal fiber 21 must be less than 500 μm. If the diameter of the crystal fiber 21 is more than 500 μm, the micro-swing will not occur before electric breakdown. Therefore, the diameter of the crystal fiber 21 fabricated in the embodiment is less than 500 μm. Additionally, the laser beam 11 generated from the laser beam generator is $CO_2$ laser beam having a wavelength of 10.6 μm.

Figure 3:
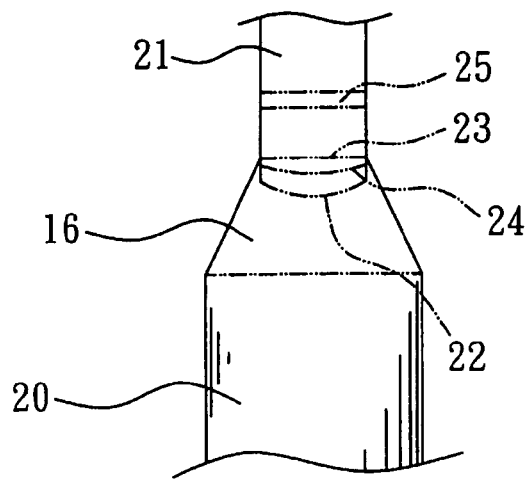
FIG. 3 is a schematic diagram showing the formation of the region of polarization inversion according to the present invention.

A ferroelectric crystalline seed is heated by the $CO_2$ annular laser beam 111 in the chamber and is dipped in the molten zone 16. Such seed is withdrawn from the molten zone 16, while the source crystal rod 20 is fed toward the same molten zone 16 so that as the seed is withdrawn, the ferroelectric crystal fiber 21 is formed at a freezing interface 23 (FIG. 3). The diameter of the grown ferroelectric crystal fiber 21 is determined by the square root of the ratio of the feed speed of the source crystal rod 20 to the pull speed of the seed, and the size of the source crystal rod 20. In operation, two metal electrodes 18,19 each having a diameter of about 580 μm are used for providing required electric field and micro-swing. In order to avoid blocking the $CO_2$ annular laser beam 111, the metal electrodes 18,19 are bent so as to fit the path of the $CO_2$ annular laser beam 111. Additionally, a stereo microscope (not shown) is used for defining the distance between the two metal electrodes 18,19 and monitoring the molten zone 16.

During the procedure of growing the lithium niobate crystal fiber 21, the lithium niobate crystal grows along X crystal axis (also called a crystal axis). Under normal growing condition, the grown lithium niobate crystal forms a bi-domain structure whose domain wall is at the center of the crystal fiber 21 due to the effect of temperature gradient and spontaneous polarization vector. However, in the present invention, the bi-domain structure can be broken so that the grown crystal fiber 21 can have periodically poled structure.

FIG. 3 is a schematic diagram showing the formation of the region of polarization inversion according to the present invention. As shown in the figure, the crystal grows along X crystal axis, and two metal electrodes 18,19 are disposed along Z crystal axis (also called c crystal axis) (FIG. 2). Because the annular laser beam 111 is focused at the tip of the source crystal rod 20, the distribution curve of an isotherm in the molten zone 16 is a symmetrical curve that is low at center and high at two sides. Therefore, the distribution curve of a solid-liquid interface 22 is also a symmetrical curve that is low at center and high at two sides. The farther the crystal fiber 21 leaves the molten zone 16, the smoother the distribution curve of the isotherm will become, and a freezing interface 23 is defined as where the distribution curve of the isotherm is horizontal. Between the solid-liquid interface 22 and the freezing interface 23 is a Curie isotherm 24, which is also a symmetrical curve. When the temperature of the ferroelectric material is higher than the Curie temperature, it will not have the property of spontaneous polarization, and is defined as paraelectric phase. The region between the Curie isotherm 24 and the solid-liquid interface 22 of the crystal fiber 21 is paraelectric phase. When the temperature of the ferroelectric material is lower than the Curie temperature, it will have the spontaneous polarization vector. Because the lithium niobate crystal grows along X crystal axis and the Curie isotherm 24 has a curved distribution, the spontaneous polarization vector of the lithium niobate crystal is toward ±Z crystal axis (or ±c crystal axis), and the bi-domain structure is formed accordingly. When an external electric field is applied, the bi-domain structure is broken and an effective poled region 25 is formed above the molten zone 16. The effective poled region 25 is determined by the external electric field and the temperature gradient. The relationship between the domain period and the growth velocity of the crystal fiber 21 can be expressed as $L_c = V_c \times T/2$, wherein $L_c$ is coherent length or domain period, $V_c$ is growth velocity of the crystal fiber 21 and T is period of the external electric field.

Figure 4A:
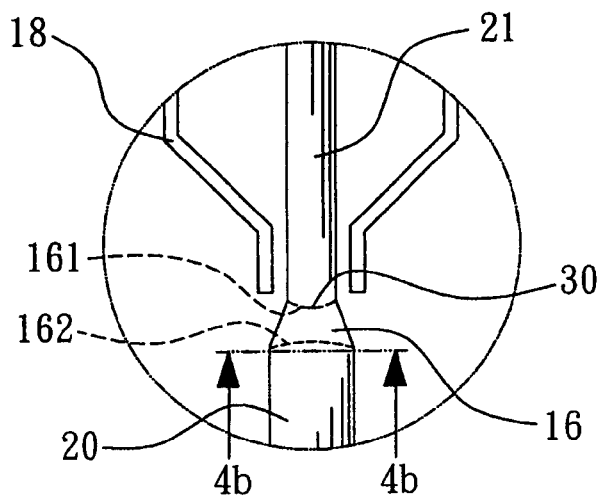
FIG. 4a is a schematic diagram showing the distribution of the space charges on the circumference of the molten zone during the growth of the crystal fiber according to the present invention.
Figure 4B:
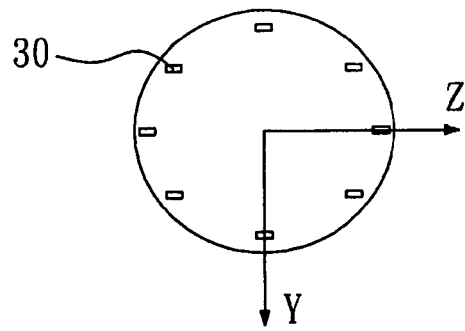

FIGS. 4a and 4b show the distribution of the space charges on the circumference of the molten zone 16 during the growth of the crystal fiber 21 according to the present invention, wherein FIG. 4b shows a cross sectional view of the lower portion of the molten zone 16. When the lithium niobate crystal is heated to the melting state, negative charges 30 will be induced and distributed on the circumferences of upper portion and lower portion of the molten zone 16 because of the ionization and precipitation of the lithium ions (Li+). The negative charges 30 may block part of the external electric field and increase difficulty of poling. Therefore, in the present invention, the two electrodes 18,19 are connected to two high-voltage sources respectively so that the negative charges 30 are attracted by positive electric field and distracted by negative electric field, which causes the micro-swing during the growth procedure of the lithium niobate crystal fiber 21.

Figure 5A:
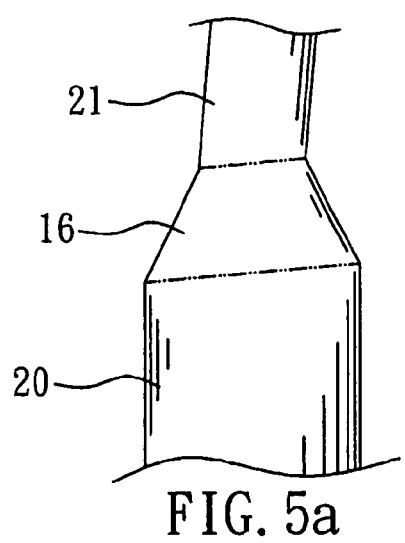
Figure 5B:
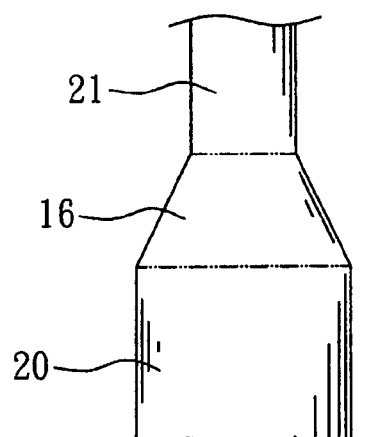
Figure 5C:
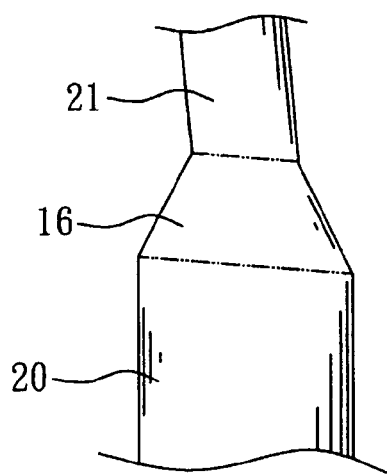

FIGS. 5a to 5c show the micro-swing occurred during the growth of the crystal fiber 21 according to the present invention; wherein FIG. 5b shows the appearance of the crystal fiber 21 without being applied by any external electric field, FIG. 5a shows that the crystal fiber 21 swings to the left when being applied by an external electric field, and FIG. 5c shows that the crystal fiber 21 swings to the right when being applied by an external electric field. It should be understood that because the micro-swing occurs, the solid-liquid interface 22 and the Curie isotherm 24 are no longer symmetrical curves, and are high at one side and low at the opposite side. Such new distribution of temperature gradient facilitates breaking the bi-domain structure of the lithium niobate crystal, and its induced pyroelectric field can compensate the part of external electric field blocked by the space charges so as to form the periodically poled structure. For one crystal, its most displacement of swing (displacement of the crystal when the crystal fiber 21 of FIG. 5a swings to the appearance of FIG. 5c) divided by the diameter of the crystal fiber 21 is defined as a swing ratio. In the embodiment, the value of the swing ratio is between 0.9 to 1.5.

In the embodiment, the source crystal rod 20 of ZnO-doped (6% mol) a-axis $LiNbO_3$ crystal has a cross section of 500×500 μm$^2$. The ratio of the pull speed of the seed to the feed speed of the source crystal rod 20 is 9:1, and the external electric field is 1 kV/mm. Under such conditions, the crystal fiber 21 having a domain period of 16.3 μm and a diameter of 200 μm is fabricated, and the variation of the diameter of the crystal fiber 21 is less than 1%.

Figure 6:
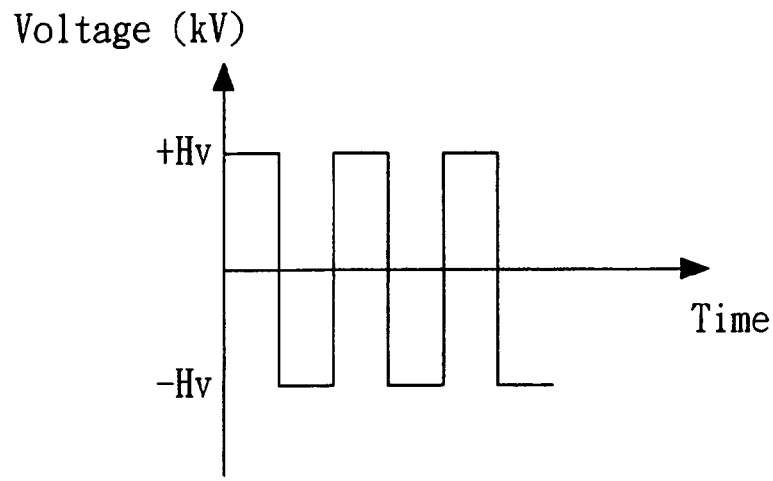
FIG. 6 shows a voltage waveform of the first high-voltage source adapted in the first method for generating the external electric field according to the present invention.

FIG. 6 shows a voltage waveform of a first high-voltage source adapted in a first method for generating the external electric field according to the present invention. In this first method, the first metal electrode 18 is connected to the ground, and the second metal electrode 19 is connected to the first high-voltage source that provides an alternating current whose waveform is alternating square wave as shown in FIG. 6.

Figure 7A:
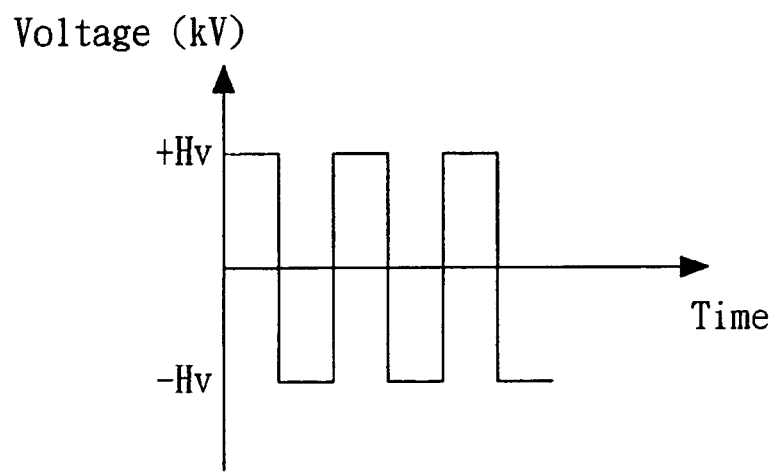
FIGS. 7a and 7b respectively show voltage waveforms of the second and third high-voltage sources adapted in the second method for generating the external electric field according to the present invention.
Figure 7B:
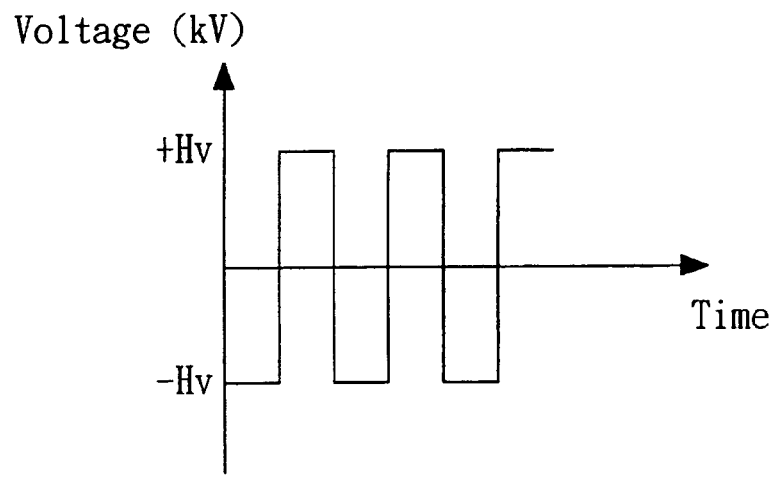

FIGS. 7a and 7b respectively show voltage waveforms of a second and third high-voltage sources adapted in the second method for generating the external electric field according to the present invention. In this second method, the first metal electrode 18 is connected to the second high-voltage source, and the second metal electrode 19 is connected to the third high-voltage source, wherein the second high-voltage source provides an alternating current whose waveform is alternating square wave as shown in FIG. 7a, and the third high-voltage source provides an alternating current whose waveform is alternating square wave as shown in FIG. 7b. As shown in the figures, the phase of the waveform of the second high-voltage source is reverse to that of the third high-voltage source.

Figure 8A:
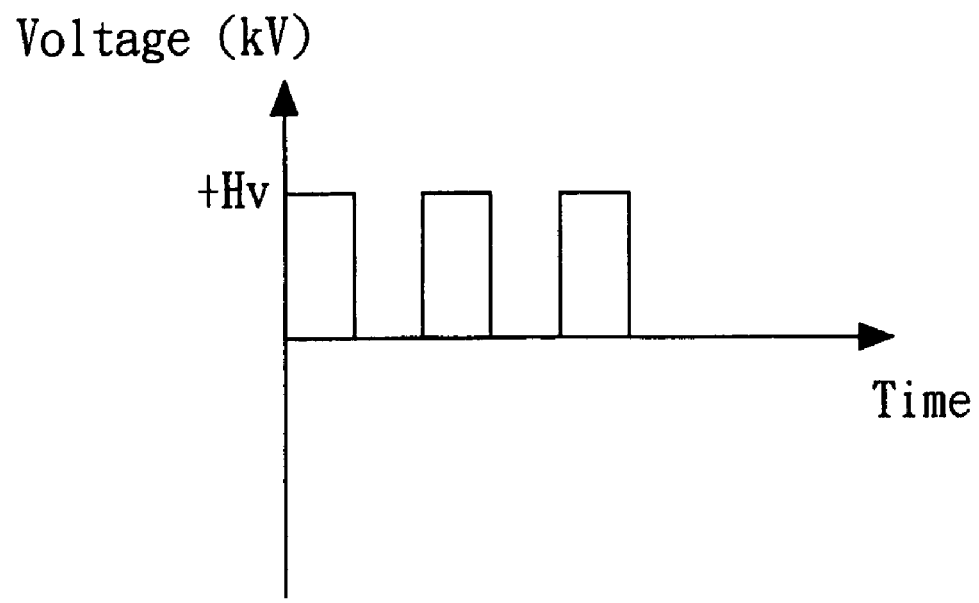
FIGS. 8a and 8b respectively show voltage waveforms of the fourth and fifth high-voltage sources adapted in the third method for generating the external electric field according to the present invention.
Figure 8B:
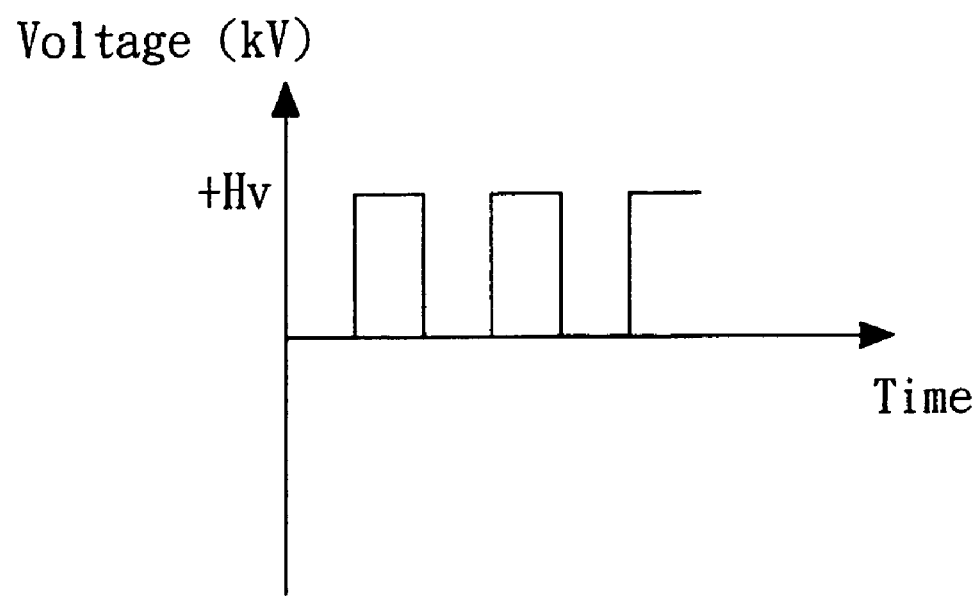

FIGS. 8a and 8b respectively show voltage waveforms of the fourth and fifth high-voltage sources adapted in a third method for generating the external electric field according to the present invention. In this third method, the first metal electrode 18 is connected to the fourth high-voltage source, and the second metal electrode 19 is connected to the fifth high-voltage source, wherein the fourth high-voltage source provides an impulse direct current whose waveform is direct impulse wave as shown in FIG. 8a, and the fifth high-voltage source provides an impulse direct current whose waveform is direct impulse wave as shown in FIG. 8b. As shown in the figures, the waveform of the fifth high-voltage source shifts one-half cycle to that of the fourth high-voltage source.

While several embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications which maintain the spirit and scope of the present invention are within the scope as defined in the appended claims.

What is claimed is:

1. A method for fabricating a crystal fiber having different regions of polarization inversion, comprising:
   (a) providing a source material;
   (b) putting the source material into a fabricating apparatus;
   (c) heating the source material to form a molten zone;
   (d) drawing a ferroelectric crystalline seed from the molten zone so as to grow a crystal fiber in a growth procedure, wherein the diameter of the crystal fiber is less than 500 μm; and
   (e) applying an external electric field on the crystal fiber during the growth procedure so as to induce micro-swing of the crystal of the crystal fiber for polarization inversion.

2. The method according to claim 1, wherein the fabricating apparatus is a laser heated pedestal growth (LHPG) apparatus.

3. The method according to claim 1, wherein the external electric field is an alternating current field.

4. The method according to claim 1, wherein the material of the source material is ferroelectric and is selected from the group consisting of lithium niobate ($LiNbO_3$), lithium tantalate ($LiTaO_3$), patassium titanyl phosphate (KTP) and a dopant therein.

5. The method according to claim 4, wherein the dopant is selected from the group consisting of the oxidation states of magnesium, zinc, yttrium, neodymium and erbium, and the mixture thereof.

6. The method according to claim 1, wherein the ratio of the displacement of the micro-swing of the crystal to the diameter of the crystal fiber is between 0.9 to 1.5.

7. The method according to claim 1, wherein the external electric field is provided by a first metal electrode and a second metal electrode, wherein the first metal electrode is connected to the ground, and the second metal electrode is connected to a first high-voltage source whose waveform is alternating square wave.

8. The method according to claim 1, wherein the external electric field is provided by a first metal electrode and a second metal electrode, wherein the first metal electrode is connected to a second high-voltage source whose waveform is alternating square wave, the second metal electrode is connected to a third high-voltage source whose waveform is alternating square wave, and the phase of the waveform of the second high-voltage source is reverse to that of the third high-voltage source.

9. The method according to claim 1, wherein the external electric field is provided by a first metal electrode and a second metal electrode, wherein the first metal electrode is connected to a fourth high-voltage source whose waveform is direct impulse wave, the second metal electrode is connected to a fifth high-voltage source whose waveform is direct impulse wave, and the waveform of the fifth high-voltage source shifts one-half cycle to that of the fourth high-voltage source.

10. A method for fabricating a crystal fiber having different regions of polarization inversion, comprising:
   (a) providing a source material;
   (b) putting the source material into a fabricating apparatus;
   (c) heating the source material to form a molten zone;
   (d) drawing a ferroelectric crystalline seed from the molten zone so as to grow a crystal fiber in a growth procedure; and
   (e) applying an external electric field on the crystal fiber during the growth procedure so as to induce micro-swing of the crystal of the crystal fiber for polarization inversion, wherein the ratio of displacement of the micro-swing of the crystal to the diameter of the crystal fiber is between 0.9 to 1.5.

11. The method according to claim 10, wherein the fabricating apparatus is a laser heated pedestal growth (LHPG) apparatus.

12. The method according to claim 10, wherein the external electric field is an alternating current field.

13. The method according to claim 10, wherein the material of the source material is ferroelectric and is selected from the group consisting of lithium niobate (LiNbO$_3$), lithium tantalate (LiTaO$_3$), patassium titanyl phosphate (KTP) and a dopant therein.

14. The method according to claim 13, wherein the dopant is selected from the group consisting of the oxidation states of magnesium, zinc, yttrium, neodymium and erbium, and the mixture thereof.

15. The method according to claim 10, wherein the external electric field is provided by a first metal electrode and a second metal electrode, wherein the first metal electrode is connected to the ground, and the second metal electrode is connected to a first high-voltage source whose waveform is alternating square wave.

16. The method according to claim 10, wherein the external electric field is provided by a first metal electrode and a second metal electrode, wherein the first metal electrode is connected to a second high-voltage source whose waveform is alternating square wave, the second metal electrode is connected to a third high-voltage source whose waveform is alternating square wave, and the phase of the waveform of the second high-voltage source is reverse to that of the third high-voltage source.

17. The method according to claim 10, wherein the external electric field is provided by a first metal electrode and a second metal electrode, wherein the first metal electrode is connected to a fourth high-voltage source whose waveform is direct impulse wave, the second metal electrode is connected to a fifth high-voltage source whose waveform is direct impulse wave, and the waveform of the fifth high-voltage source shifts one-half cycle to that of the fourth high-voltage source.

* * * * *